(12) United States Patent  
Muro et al.

(10) Patent No.: US 9,548,217 B2
(45) Date of Patent: Jan. 17, 2017

(54) ETCHING METHOD OF SEMICONDUCTOR SUBSTRATE, AND METHOD OF PRODUCING SEMICONDUCTOR DEVICE

(71) Applicant: FUJIFILM CORPORATION, Tokyo (JP)

(72) Inventors: Naotsugu Muro, Shizuoka (JP); Tetsuya Kamimura, Shizuoka (JP); Tadashi Inaba, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/711,070

(22) Filed: May 13, 2015

(65) Prior Publication Data

US 2015/0243527 A1 Aug. 27, 2015

Related U.S. Application Data

(63) Continuation of application No. PCT/JP2013/080576, filed on Nov. 12, 2013.

(30) Foreign Application Priority Data

Nov. 14, 2012 (JP) ................................. 2012-250364

(51) Int. Cl.
*H01L 21/461* (2006.01)
*H01L 21/3213* (2006.01)
(Continued)

(52) U.S. Cl.
CPC ......... *H01L 21/32134* (2013.01); *C09K 13/08* (2013.01); *H01L 21/31144* (2013.01)

(58) Field of Classification Search
CPC ... H01L 21/311; H01L 21/31144; H01L 21/308; H01L 21/304; C09K 13/08; C09K 8/08
(Continued)

(56) References Cited

U.S. PATENT DOCUMENTS 8,283,259 B2 * 10/2012 Sapra ................ H01L 21/32115
438/689
2006/0234502 A1 * 10/2006 Bhat ................ H01L 21/28088
438/656
(Continued)

FOREIGN PATENT DOCUMENTS

| CN | 101233601 A | 7/2008 |
| CN | 101410481 A | 4/2009 |

(Continued)

OTHER PUBLICATIONS

International Search Report of PCT/JP2013/080576, dated Dec. 17, 2013. [PCT/ISA/210].
(Continued)

*Primary Examiner* — Duy Deo
*Assistant Examiner* — Maki Angadi
(74) *Attorney, Agent, or Firm* — Sughrue Mion, PLLC (57) ABSTRACT

An etching method containing, at the time of processing a substrate having a first layer containing titanium nitride (TiN) and a second layer containing a transition metal, selecting a substrate in which a surface oxygen content of the first layer is from 0.1 to 10% by mole, and applying an etching liquid containing a hydrofluoric acid compound and an oxidizing agent to the substrate and thereby removing the first layer.

20 Claims, 2 Drawing Sheets

(51) Int. Cl.
*H01L 21/311* (2006.01)
*C09K 13/08* (2006.01)

(58) Field of Classification Search
USPC .... 438/694, 754; 216/37, 67; 252/79.1–79.4
See application file for complete search history.

(56) References Cited

U.S. PATENT DOCUMENTS

| 2009/0017626 A1* | 1/2009 | Park | C09K 13/08 |
| | | | 438/694 |
| 2009/0017636 A1* | 1/2009 | Kumazawa | H01L 21/32134 |
| | | | 438/745 |

FOREIGN PATENT DOCUMENTS

| JP | 7-281445 A | 10/1995 |
| JP | 11-145144 A | 5/1999 |
| JP | 2005-97715 A | 4/2005 |
| JP | 2008-285508 A | 11/2008 |
| JP | 2009-19255 A | 1/2009 |
| JP | 2009-21516 A | 1/2009 |
| JP | 2009-44129 A | 2/2009 |
| JP | 4896995 B2 | 3/2012 |
| WO | 2012/048079 A2 | 4/2012 |

OTHER PUBLICATIONS

Communication dated Jul. 27, 2016, from the State Intellectual Property Office of People's Republic of China in counterpart Application No. 201380059067.6.

\* cited by examiner

ETCHING METHOD OF SEMICONDUCTOR SUBSTRATE, AND METHOD OF PRODUCING SEMICONDUCTOR DEVICE

CROSS-REFERENCE TO RELATED APPLICATIONS

This application is a continuation of PCT/JP2013/080576 filed on Nov. 12, 2013 which claims benefit of Japanese Patent Application No. 2012-250364 filed on Nov. 14, 2012, the subject matters of which are incorporated herein by reference in their entirety.

TECHNICAL FIELD

The present invention relates to an etching method of a semiconductor substrate and a method of producing a semiconductor device.

BACKGROUND ART

Miniaturization and diversification of semiconductor devices have progressed more and more, and a processing method thereof covers a wide range with respect to each of device structures and production steps. As regards etching of the substrate, development of both dry etching and wet etching has been advanced and a variety of chemical liquids and processing conditions have been proposed depending on kinds and structures of the substrate material.

Above all, when a device structure of CMOS, DRAM or the like is produced, a technique of etching a prescribed material precisely is important and as one of techniques of addressing such problem, a wet etching which utilizes a chemical liquid is exemplified. For example, a precise etching processing is required in the production of circuit wiring of a microscopic transistor circuit, a metal electrode material, or a substrate having a barrier layer, a hard mask, and the like. However, sufficient study has not yet been done on etching conditions and chemical liquids suitable for each of the substrates containing a wide variety of metal compounds. Under these circumstances, an efficient removal of a hard mask or the like applied to the device substrate has been laid out as a production problem. Specifically, there are examples of studies on chemical liquids for etching titanium nitride (TiN) (see Patent Literatures 1 to 6).

CITATION LIST

Patent Literatures

Patent Literature 1: JP-A-2005-097715 ("JP-A" means unexamined published Japanese patent application)
Patent Literature 2: Japanese Patent No. 4,896,995
Patent Literature 3: JP-A-2009-021516
Patent Literature 4: JP-A-2009-019255
Patent Literature 5: JP-A-2009-044129
Patent Literature 6: US 2009/0017626

SUMMARY OF INVENTION

Technical Problem

The above-described Literatures 3 to 6 each disclose etching liquids in which hydrofluoric acid and hydrogen peroxide are mixed. According to confirmation by the present inventors, however, they have come to see that a surface of the TiN layer after etching becomes non-uniform by simply using the etching liquid having the above-described formula, thereby causing a partial residue after etching (etching unevenness).

In view of the exacting request level by the present-day semiconductor industries, improvement in such non-uniformity of the substrate surface has been desired. Further, achievement of uniformization after etching of a metal surface provided together has also been required at the same time.

In view of the above, the present invention addresses the provision of an etching method which, in etching a first layer containing titanium nitride (TiN), can achieve uniformization after etching of the above TiN layer and metal layer, an etching liquid used in the method, and a method of producing a semiconductor device using the same.

Solution to Problem

The above problems can be solved by the following means.

[1] An etching method comprising: at the time of processing a substrate having a first layer containing titanium nitride (TiN) and a second layer containing a transition metal, selecting a substrate in which a surface oxygen content of the first layer is from 0.1 to 10% by mole; and applying an etching liquid containing a hydrofluoric acid compound and an oxidizing agent to the substrate and thereby removing the first layer.

[2] The etching method described in the item [1], wherein the transition metal is selected from Co, Ni, Cu, Ag, Ta, Hf, W, Pt and Au.

[3] The etching method described in the item [1] or [2], wherein the hydrofluoric acid compound is a hydrofluoric acid or its salt.

[4] The etching method described in any one of the items [1] to [3], wherein the oxidizing agent is a nitric acid or a hydrogen peroxide.

[5] The etching method described in any one of the items [1] to [4], wherein an etching rate (R1) of the first layer is 200 Å/min or greater and less than 300 Å/min.

[6] The etching method described in any one of the items [1] to [5], wherein the etching liquid further contains at least one surface uniformizing agent selected from the group consisting of a nitrogen-containing organic compound, an aromatic compound and an oxygen-containing organic compound.

[7] The etching method described in the item [6], wherein the surface uniformizing agent includes a compound represented by any one of the following formulae (I) to (IX):

-continued (III)

(IV)

(V)

(VI)

(VII)

(VIII)

(IX)

wherein $R^1$ to $R^{30}$ each independently represent a hydrogen atom or a substituent; in this case, neighbors adjacent to each other may be linked or ring-fused to form a cyclic structure; A represents a nitrogen atom.

[8] The etching method described in the item [6], wherein the surface uniformizing agent is at least one selected from the group consisting of an alcohol compound having 2 to 15 carbon atoms and an ether compound having 2 to 15 carbon atoms.

[9] The etching method described in any one of the items [6] to [8], wherein the surface uniformizing agent is contained in a range of from 0.01 to 10% by mass.

[10] The etching method described in any one of the items [1] to [9], wherein the hydrofluoric acid compound is contained in a range of from 0.01 to 3% by mass.

[11] The etching method described in any one of the items [1] to [10], wherein the oxidizing agent is contained in a range of from 0.05 to 30% by mass.

[12] The etching method described in any one of the items [1] to [11], wherein a pH of the etching liquid is in a range of −1 or more and 5 or less.

[13] The etching method described in any one of the items [1] to [12], wherein a thickness of the first layer is from 0.005 to 0.3 μm.

[14] An etching liquid for processing a substrate having a first layer containing titanium nitride (TiN) and a second layer containing a transition metal and for applying to a selected substrate in which a surface oxygen content of the first layer is from 0.1 to 10% by mole, wherein the etching liquid contains a hydrofluoric acid compound and an oxidizing agent.

[15] The etching liquid described in the item [14], wherein the hydrofluoric acid compound is contained in a range of from 0.01 to 3% by mass.

[16] The etching liquid described in the item [14] or [15], wherein the oxidizing agent is contained in a range of from 0.05 to 30% by mass.

[17] The etching liquid described in any one of the items [14] to [16], wherein a pH is from −1 to 5.

[18] The etching liquid described in any one of the items [14] to [17], further containing at least one surface uniformizing agent selected from the group consisting of a nitrogen-containing organic compound, an aromatic compound and an oxygen-containing organic compound.

[19] A method of producing a semiconductor device comprising: removing a first layer containing titanium nitride (TiN) by the etching method described in any one of the items [10] to [13]; and then producing the semiconductor device from the remaining substrate.

Advantageous Effects of Invention

According to the method of the present invention, at the time of etching a first layer containing titanium nitride (TiN), surface uniformization after etching of the metal layer (second layer) can also be achieved together with surface uniformization (suppression of etching unevenness) after etching of the first TiN layer.

Other and further features and advantages of the invention will appear more fully from the following description, appropriately referring to the accompanying drawings.

DESCRIPTION OF EMBODIMENTS

Figure 1:
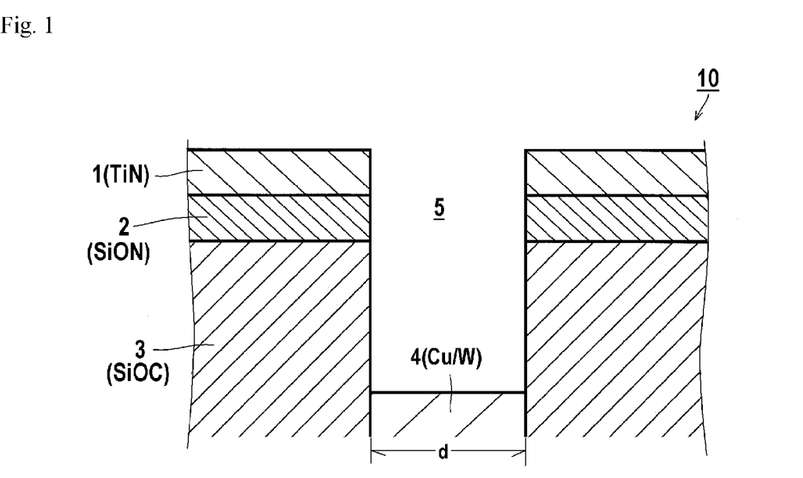
FIG. 1 is a section view diagrammatically showing an example of a production step of a semiconductor substrate (before etching) according to one embodiment of the present invention.
Figure 2:
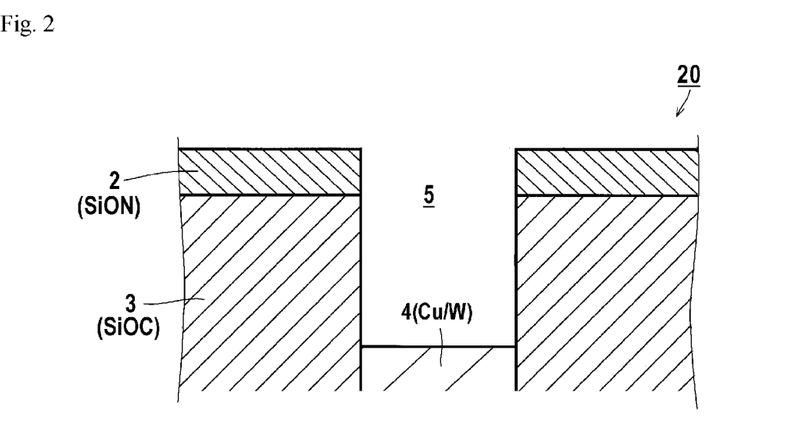
FIG. 2 is a section view diagrammatically showing an example of a production step of a semiconductor substrate (after etching) according to one embodiment of the present invention.

First, preferable embodiments of the etching step concerning the etching method of the present invention are explained on the basis of FIG. 1 and FIG. 2.

[Etching Process]

FIG. 1 is a view showing a semiconductor substrate before etching. In the production example of the present embodiment, a layered product is used, in which SiOC layer 3 and SiON layer 2 as a specific third layer are disposed on a silicon wafer (not shown) and TiN layer 1 is formed on the third layer. At this time, via 5 has been formed already in the above-described composite layer and, a second layer (metal layer) 4 containing a metal has been formed at the bottom of via 5. Onto substrate 10 at this state, an etching liquid (not shown) according to the present embodiment is applied to remove the TiN layer. As a result, substrate 20 having a configuration in which the TiN film has been removed as shown in FIG. 2 can be obtained. Needless to say, although the etching as graphically shown is ideal in the present invention and a preferable embodiment thereof, a remainder of the TiN layer or alternatively some corrosion of the second layer is appropriately acceptable according to a required quality of a semiconductor device to be produced and the like and, therefore, the present invention is not construed to a limited extent by the above description.

Note that, when a silicon substrate or a semiconductor substrate, or simply a substrate is mentioned, these are used in the sense of including not only a silicon wafer but also a whole substrate structure provided with a circuit structure. The term "the element of the substrate" refers to an element that constitutes the silicon substrate that is defined above, and may be made of a single material or a plurality of materials. A processed semiconductor substrate is sometimes called as a semiconductor substrate product by a distinction. A tip or a processed product thereof, which has been obtained by further processing the semiconductor substrate, if needed, and then by singulating the same is referred to as semiconductor device or semiconductor equipment. That is to say, in the broad sense, the semiconductor device belongs to the semiconductor substrate product. With respect to the direction of the semiconductor, in reference to FIG. 1, the opposite side to the silicon wafer (TiN side) is called as "upper", or "head edge", while the silicon wafer side (SiOC side) is called as "under", or "bottom".

[Etching Liquid]

Next, a preferable embodiment of the etching liquid of the present invention is explained. The etching liquid of the present embodiment contains an oxidizing agent and a hydrofluoric acid compound. Hereinafter, each of the components including optional ones is explained.

(Oxidizing Agent)

Examples of the oxidizing agent include nitric acid, hydrogen peroxide, ammonium persulfate, perboric acid, peracetic acid, periodic acid, perchloric acid, or a combination thereof. Among them, nitric acid or hydrogen peroxide is particularly preferable.

The oxidizing agent is preferably contained in an amount of 0.05% by mass or more, more preferably in an amount of 0.1% by mass or more, and particularly preferably in an amount of 0.3% by mass or more, with respect to the total amount of the etching liquid of the present embodiment. The upper limit is preferably 30% by mass or less, more preferably 25% by mass or less, and still more preferably 20% by mass or less. By setting to the above upper limit or less, excess etching of the second layer can preferably be suppressed to a higher level. Setting to the above lower limit is preferable from the viewpoint of etching the first layer in a sufficient rate. Further, by adjusting this amount to the preferable range, uniformization on an etching surface of the first layer can preferably be achieved more effectively.

As the above-described oxidizing agent, one kind thereof may be used solely, or two or more kinds thereof may be used in combination.

(Hydrofluoric Acid Compound)

A hydrofluoric acid compound means a compound which generates a fluorine ion ($F^-$) in a system, and defined as a compound which includes a hydrofluoric acid and salts thereof. Specifically, examples of the hydrofluoric acid compound include hydrofluoric acid, alkali metal fluorides (NaF, KF, and the like), amine hydrofluoride (monoethylamine hydrofluoride, triethylamine trihydrofluoride, and the like), pyridine hydrofluoride, ammonium fluoride, quaternary alkyl ammonium fluoride (tetramethyl ammonium fluoride, tetra n-butyl ammonium fluoride, and the like), $H_2SiF_6$, $HBF_4$ and $HPF_6$. Among them, hydrofluoric acid, amine hydrofluoride (monoethylamine hydrofluoride, triethylamine trihydrofluoride, and the like), pyridine hydrofluoride, ammonium fluoride, quaternary alkyl ammonium fluoride (tetramethyl ammonium fluoride, tetra n-butyl ammonium fluoride, and the like), $H_2SiF_6$, $HBF_4$ and $HPF_6$ are preferable, hydrofluoric acid, ammonium fluoride, quaternary alkyl ammonium fluoride (tetramethyl ammonium fluoride), $H_2SiF_6$, $HBF_4$ and $HPF_6$ are more preferable, hydrofluoric acid is particularly preferable.

The hydrofluoric acid compound is preferably incorporated in an amount of 0.01% by mass or more, more preferably incorporated in an amount of 0.05% by mass or more, and particularly preferably incorporated in an amount of 0.1% by mass or more, with respect to the total mass of the etching liquid according to the present embodiment. The upper limit thereof is preferably 3% by mass or less, more preferably 1.5% by mass or less, and particularly preferably 1% by mass or less.

In relation to the oxidizing agent, the hydrofluoric acid compound is preferably used in an amount of 0.1 part by mass or more, and more preferably in an amount of 1 part by mass or more, with respect to 100 parts by mass of the oxidizing agent. The upper limit thereof is preferably 100 parts by mass or less, more preferably 50 parts by mass or less, and particularly preferably 10 parts by mass or less. By using the amounts of both compounds in a suitable relation, a good etching performance can be realized and also high in-plane uniformity can be achieved together as described above.

As the above-described hydrofluoric acid compound, one kind thereof may be used solely, or two or more kinds thereof may be used in combination.

(Surface Uniformizing Agent)

It is preferable for the etching liquid of the present invention to contain a surface uniformizing agent that improves uniformity in etching of the second layer. By this addition, uniformization (suppression effect of etching unevenness) on a surface of the first layer after etching can be increased to a higher extent, and further surface uniformization of the second layer can also be achieved. By coupling with achievement of surface uniformity of the above first layer (TiN layer), increase in surface uniformity of the metal layer provided together (second layer) makes it possible to contribute greatly to the improvement in production process and the advance in production quality, in comparison with the counterpart having uniformity solely.

Nitrogen-Containing Organic Compound/Aromatic Compound

The surface uniformizing agent is preferably a nitrogen-containing organic compound. In particular, a 5- or 6-membered nitrogen-containing heterocyclic compound (the hetero atom is a nitrogen atom) is preferable. Alternatively, as a preferable surface uniformizing agent, an aromatic compound is exemplified. The heterocyclic compound and the aromatic compound may be monocyclic or polycyclic. Above all, a 5-membered nitrogen-containing heteroaromatic compound is more preferable. The number of nitrogen to be contained at this time is preferably from 1 to 4. As the aromatic compound, a compound having a benzene ring is preferable.

The surface uniformizing agent is preferably a compound represented by any one of the following formulae (I) to (IX).

(I)

(II)

(III)

(IV)

(V)

(VI)

(VII)

(VIII)

-continued (IX)

$R^1$ to $R^{30}$

In formulae (I) to (IX), $R^1$ to $R^{30}$ each independently represent a hydrogen atom or a substituent. Examples of the substituent include an alkyl group (having preferably 1 to 20 carbon atoms) described below, an alkenyl group (having preferably 2 to 20 carbon atoms), an aryl group (having preferably 6 to 24 carbon atoms), a heterocyclic group (having preferably 1 to 20 carbon atoms), an alkoxy group (having preferably 1 to 20 carbon atoms), an acyl group (having preferably 2 to 20 carbon atoms), an amino group (having preferably 0 to 6 carbon atoms), a carboxyl group, a phosphoric acid group, a hydroxy group, a thiol group (—SH), and a boronic acid group (—B(OH)$_2$). Note that, as the aryl group, a phenyl group or a naphthyl group is preferred. The above-described heterocyclic group includes a nitrogen-containing heteroaromatic group. Above all, a 5-membered nitrogen-containing heteroaromatic group is preferred and a pyrrole group, an imidazole group, a pyrazole group, a triazole group, or a tetrazole group is more preferred. Furthermore, these substituents may have a substituent within the scope in which the effect of the present invention is exerted. Note that, among the above-described substituents, an amino group, a carboxyl group, a phosphoric acid group, and a boronic acid group may form their salts. Examples of the counter ion that forms the salt include quaternary ammonium ions such as ammonium ion (NH$_4^+$) and tetramethyl ammonium ion ((CH$_3$)$_4$N$^+$).

The above-described substituent may be substituted through an arbitrary linking group. The linking group includes an alkylene group (the number of carbon atoms is preferably 1 to 20), an alkenylene group (the number of carbon atoms is preferably 2 to 20), an ether group (—O—), an imino group (the number of carbon atoms is preferably 0 to 4), a thioether group (—S—), a carbonyl group, or a combination thereof. Hereinafter, these linking groups are called "linking group L". Furthermore, these linking groups may have a substituent within the scope in which the effect of the present invention is exerted.

As $R^1$ to $R^{30}$ above all, an alkyl group having 1 to 6 carbon atoms, a carboxyl group, an amino group (the number of carbon atoms is preferably 0 to 4), a hydroxyl group, or a boronic acid group is preferred. As described above, these substituents may be substituted through the linking group L.

Further, as for $R^1$ to $R^{30}$, neighbors adjacent to each other may be linked or ring-fused to form a cyclic structure. Examples of the ring structure to be formed include a pyrrole ring structure, an imidazole ring structure, a pyrazole ring structure, or a triazole ring structure. Furthermore, these ring-structural sites may have a substituent within the scope in which the effect of the present invention is exerted. Note that, when the ring structure to be formed is a benzene ring, this ring structure is sectionalized into formula (VII) to organize it.

A

A represents a nitrogen atom.

The compound represented by the above-described formula (VII) is preferably a compound represented by any one of the following formulae (VII-1) to (VII-4).

$R^a$ represents an acid group, preferably a carboxyl group, a phosphoric acid group, or a boronic acid group. The above-described acid group may be substituted through the above-described linking group L.

$R^b$ represents an alkyl group having 1 to 6 carbon atoms, an amino group (preferably 0 to 4 carbon atoms), a hydroxyl group, an alkoxy group (preferably 1 to 6 carbon atoms), or an acyl group (preferably 1 to 6 carbon atoms). The above-described substituent $R^b$ may be substituted through the above-described linking group L. When a plurality of $R^b$'s are present, these may be linked or ring-fused to form a ring structure.

n1 is an integer of 1 to 5. n2 is an integer of 0 to 5. n3 is an integer of 0 to 4.

When each of n1 to n3 is 2 or more, a plurality of substituents defined there may be the same or different from one another.

In the formulae, A has the same definition as A defined above. $R^c$, $R^d$ and $R^e$ are the same groups as the defined groups for $R^1$ to $R^{30}$.

Hereinafter, examples of the compounds represented by any one of the above-described formulae (I) to (IX) are shown. However, the present invention is not construed as being limited on the basis of these compounds.

Note that, in the following exemplified compounds, the case of showing an example of a tautomer thereof is included. The other tautomer is also included in preferable examples of the present invention. The same is also true on the above-described formulae (I) to (IX) and (VII-1) to (VII-4).

I-1

I-2

I-3

I-4

I-5

I-6

III-1

III-2

III-3

III-4

III-5

IV-1

The content of the nitrogen-containing organic compound or the aromatic compound that constitutes the surface uniformizing agent, although it is not limited in particular, is preferably 0.01% by mass or more, more preferably 0.05% by mass or more, and particularly preferably 0.1% by mass or more, in the etching liquid. The upper limit, although it is not limited in particular, is preferably 10% by mass or less, more preferably 5% by mass or less, still more preferably 3% by mass or less, and particularly preferably 1% by mass or less. By setting to the above lower limit or more, a suitable uniformization effect for the second layer can preferably be obtained. On the other hand, setting to the above-described upper limit or less is preferable from the viewpoint that it does not interfere with a good etching performance.

Oxygen-Containing Organic Compound

It is also preferable that the etching liquid according to the present invention contains an oxygen-containing organic compound as the above-described surface uniformizing agent. The oxygen-containing organic compound is preferably a compound that acts as a water-soluble organic solvent. The water-soluble organic solvent is preferably an organic solvent that is miscible with water in an arbitrary proportion.

Examples of the oxygen-containing organic compound include: alcohol compound solvents such as methyl alcohol, ethyl alcohol, 1-propyl alcohol, 2-propyl alcohol, 2-butanol, ethylene glycol, propylene glycol, glycerin, 1,6-hexanediol, cyclohexanediol, sorbitol, xylitol, 2-methyl-2,4-pentanediol, 1,3-butanediol, and 1,4-butanediol; and ether compound solvents including alkylene glycol alkyl ethers (ethylene glycol monomethyl ether, ethylene glycol monobutyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tri propylene glycol monomethyl ether, diethylene glycol monobutyl ether, diethylene glycol monobutyl ether, and the like).

Above all, alcohol compound solvents having 2 to 15 carbon atoms and hydroxyl group-containing ether compound solvents having 2 to 15 carbon atoms are preferable, and more preferably hydroxyl group-containing alcohol compound solvents having 2 to 10 carbon atoms and hydroxyl group-containing ether compound solvents having 2 to 10 carbon atoms. In particular, alkylene glycol alkyl ethers having 3 to 8 carbon atoms are preferable. The oxygen-containing organic compound may be used solely or in an adequate combination of two or more kinds. Note that, in the present specification, the compound having both a hydroxyl group (—OH) and an ether group (—O—) in the molecule shall be basically included in the ether compound (it is not called an alcohol compound), and when the compound having both the hydroxyl group and the ether group is referred to by a distinction in particular, sometimes it may be called a hydroxyl group-containing ether compound.

Among these, diethylene glycol monomethyl ether, tetraethylene glycol dimethyl ether, propylene glycol, and triethylene glycol dimethyl ether are preferable; and diethylene glycol monomethyl ether is most preferable.

The above-described oxygen-containing organic compound is preferably a compound represented by the following formula (O-1).

$$R^{11}-(-O-R^{13}-)_n-O-R^{12} \quad (O\text{-}1)$$

$R^{11}$, $R^{12}$ $R^{11}$ and $R^{12}$ are each independently a hydrogen atom or an alkyl group having 1 or more and 5 or less carbon atoms. Among these, they are each independently preferably an alkyl group having 1 or more and 5 or less carbon atoms, and more preferably an alkyl group having 1 or more and 3 or less carbon atoms.

$R^{13}$ $R^{13}$ is a straight-chain or branched-chain alkylene chain having 1 or more and 4 or less carbon atoms. When a plurality of $R^{13}$'s are present, they may be different from one another.

n n is an integer of 1 or more and 6 or less.

The addition amount of the oxygen-containing organic compound is preferably from 0.1 to 70% by mass, and more preferably from 10 to 50% by mass, with respect to the total mass of the etching liquid. By setting the addition amount to the above-described lower limit or greater, improvement in uniformity of the above-described etching can be effectively realized.

As the above-described surface uniformizing agent, one kind thereof may be used solely, or two or more kinds thereof may be used in combination.

It is noted that in the present specification, the representation of the compound (for example, when the name of a chemical is called by putting the term "compound" at the foot of the chemical name) is used in the sense that not only the compound itself, but also its salt, and its ion are incorporated therein. Further, it is used in the sense that the compound means to include a derivative thereof which is modified in a predetermined part, such as introduction of a substituent, within a range of achieving a desired effect.

In the present specification, a substituent (a linking group is also the same) that is not specified by substitution or non-substitution means that the substituent may have an optional substituent. This is applied to the compound that is not specified by substitution or non-substitution. Preferable examples of the substituent include the substituent T described below.

The substituent T includes the following substituents.

The substituents include an alkyl group (preferably an alkyl group having 1 to 20 carbon atom(s), for example, methyl, ethyl, isopropyl, t-butyl, pentyl, heptyl, 1-ethylpentyl, benzyl, 2-ethoxyethyl, and 1-carboxymethyl), an alkenyl group (preferably an alkenyl group having 2 to 20 carbon atoms, for example, vinyl, allyl, and oleyl), an alkynyl group (preferably an alkynyl group having 2 to 20 carbon atoms, for example, ethynyl, butadiynyl, and phenylethynyl), a cycloalkyl group (preferably a cycloalkyl group having 3 to 20 carbon atoms, for example, cyclopropyl, cyclopentyl, cyclohexyl, and 4-methylcyclohexyl), an aryl group (preferably an aryl group having 6 to 26 carbon atoms, for example, phenyl, 1-naphthyl, 4-methoxyphenyl, 2-chlorophenyl, and 3-methylphenyl), a heterocyclic group (preferably a heterocyclic group having 2 to 20 carbon atoms, more preferably a 5- or 6-membered heterocyclic group having at least one hetero atom selected from nitrogen, oxygen and sulfur atoms, for example, 2-pyridyl, 4-pyridyl, 2-imidazolyl, 2-benzimidazolyl, and 2-oxazolyl), an alkoxy group (preferably an alkoxy group having 1 to 20 carbon atom(s), for example, methoxy, ethoxy, isopropyloxy, and benzyloxy), an aryloxy group (preferably an aryloxy group having 6 to 26 carbon atoms, for example, phenoxy, 1-naphthyloxy, 3-methylphenoxy, and 4-methoxyphenoxy), an alkoxycarbonyl group (preferably an alkoxycarbonyl group having 2 to 20 carbon atoms, for example, ethoxycarbonyl and 2-ethylhexyloxycarbonyl), an amino group (preferably an amino group, an alkylamino group or an aryl amino group having 0 to 20 carbon atom(s), for example, amino, N,N-dimethylamino, N,N-diethylamino, N-ethylamino, and anilino), a sulfamoyl group (preferably a sulfamoyl group having 0 to 20 carbon atom(s), for example, N,N-dimethylsulfamoyl, and N-phenylsulfamoyl), an acyl group (preferably an acyl group having 1 to 20 carbon atom(s), for example, acetyl, propionyl, butyryl and benzoyl), an acyloxy group (preferably an acyloxy group having 1 to 20 carbon atom(s), for example, acetyloxy and benzoyloxy), a carbamoyl group (preferably a carbamoyl group having 1 to 20 carbon atom(s), for example, N,N-dimethylcarbamoyl and N-phenylcarbamoyl), an acylamino group (preferably an acylamino group having 1 to 20 carbon atom(s), for example, acetylamino and benzoyl amino), a sulfonamide group (preferably a sulfonamide group having 0 to 20 carbon atom(s) for example, methanesulfonamide, benzenesulfonamide, N-methylmethanesulfonamide, N-ethylbenzenesulfonamide), an alkylthio group (preferably an alkylthio group having 1 to 20 carbon atom(s), for example, methylthio, ethylthio, isopropylthio, benzylthio), an arylthio group (preferably an arylthio group having 6 to 26 carbon atoms, for example, phenylthio, 1-naphthylthio, 3-methylphenylthio, 4-methoxyphenylthio), an alkyl- or aryl-sulfonyl group (preferably an alkyl- or aryl-sulfonyl group having 1 to 20 carbon atoms, for example, methylsulfonyl, ethylsulfonyl, benzenesulfonyl), a hydroxyl group, a cyano group, a halogen atom (for example, a fluorine atom, a chlorine atom, a bromine atom, and an iodine atom). Among them, an alkyl group, an alkenyl group, an aryl group, a heterocyclic group, an alkoxy group, an aryloxy group, an alkoxycarbonyl group, an amino group, an acylamino group, a hydroxyl group, or a halogen atom is more preferable. An alkyl group, an alkenyl group, a heterocyclic group, an alkoxy group, an alkoxycarbonyl group, an amino group, an acylamino group, or a hydroxyl group is particularly preferable.

Further, each of these groups exemplified as the substituent T may be substituted with the above-described substituent T.

When a compound, a substituent, a linking group or the like contains an alkyl group, an alkylene group, an alkenyl group, an alkenylene group or the like, these groups may be a cyclic group or a chain group, may be linear or branched, and may be substituted or unsubstituted as described above. Furthermore, when the compound, the substituent, the linking group or the like contains an aryl group, a heterocyclic group or the like, they may be monocyclic or fused-cyclic, and may be substituted or unsubstituted as described above.

In the present specification, as regards each of technical items such as temperature and thickness including choices of substituents and linking groups of the compound, even if lists of the technical items are each independently described, these can be combined mutually.

(Aqueous Medium)

The etching liquid of the present invention is preferably an aqueous solution in which water (aqueous medium) is applied as a medium and each of components contained therein is uniformly dissolved. The content of water is preferably from 50 to 99.5% by mass and more preferably from 55 to 95% by mass, with respect to the total mass of the etching liquid. Thus, a composition composed primarily of water (50% by mass or more) is sometimes called as an aqueous composition in particular, and preferable in terms of more inexpensive and more adaptable to the environment, compared to a composition with a high ratio of an organic solvent. It is preferable from this viewpoint that the etching liquid of the present invention is an aqueous composition. The water (aqueous medium) may be an aqueous medium containing components dissolved therein in an amount by which the effects of the present invention are not deteriorated, or may contain inevitable small amount of mixed components. Especially, water which has been subjected to a purifying process, such as distilled water, ion-exchanged water and ultrapure water is preferable and the ultrapure water which is used for production of the semiconductor is particularly preferable.

(pH)

In the present invention, the pH of the etching liquid is preferably controlled to −1 or greater, more preferably 1 or greater, and particularly preferably 2 or greater. As the upper limit side, the pH is preferably controlled to be 5 or less, more preferably 4 or less, and still more preferably 3 or less. Setting to the above-described lower limit or greater is preferable from the viewpoint that not only the etching rate of TiN can be increased to a practical level but also the in-plane uniformity can be improved to a higher level. On the other hand, setting to the above-described upper limit or less is preferable for anticorrosion property to the other substrate such as SiO and SiOC. Note that, in the present specification, the pH is expressed by a value measured at room temperature)(25° using F-51 (trade name) manufactured by HORIBA, Ltd.

(Other Components)

pH Controlling Agent

In the present embodiment, the pH of the etching liquid is controlled to be within the above-described range and a pH controlling agent is preferably used for the control thereof. As the pH controlling agent, in order to increase the pH, use of quaternary ammonium salts such as tetramethyl ammonium salts, choline and the like, alkali metal hydroxides such as potassium hydroxide and alkaline-earth metal hydroxides, or amino compounds such as 2-aminoethanol, guanidine and the like is preferred. In order to decrease the pH, inorganic acids such as hydrochloric acid, nitric acid, sulfuric acid, and phosphoric acid; and organic acids such as formic acid, acetic acid, propionic acid, butyric acid, valeric acid, 2-methyl butyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid.

The use amount of the pH controlling agent is not limited in particular, and the pH controlling agent may be used in an amount necessary to adjust the pH within the above range.

(Kit)

The etching liquid of the present invention may be constituted as a kit in which the raw materials thereof are divided into multiple parts. Examples of the kit include an embodiment in which, as a first liquid, a liquid composition in which the above-described hydrofluoric acid compound is contained in an aqueous medium is prepared, and, as a second liquid, a liquid composition in which the above-described oxidizing agent is contained in an aqueous medium is prepared. As an example of the use thereof, preferred is an embodiment in which both liquids are mixed to prepare an etching liquid, and after that, the etching liquid is applied to the above-described etching process on a timely basis. This avoids the etching liquid from causing deterioration of the liquid properties due to decomposition of the oxidizing agent (for example, hydrogen peroxide) whereby a desired etching function can be effectively exhibited. Herein, the term "on a timely basis (timely)" after mixing defines the meaning of a period of time prior to a desired function being lost after mixing. Specifically, the period of time is preferably within 60 minutes, more preferably within 30 minutes, and particularly preferably within 10 minutes. Although there is no lower limit in particular, the period of one second or longer is practical.

The concentration of the hydrofluoric acid compound in the first liquid, although it is not particularly limited, is preferably 1.0% by mass or more and more preferably 2.0% by mass or more. The upper limit thereof is preferably 10% by mass or less and more preferably 5% by mass or less. By setting the concentration to the above-described range, a condition suitable for mixing with the second liquid can be achieved and a favorable concentration region in the above-described etching liquid can preferably be achieved.

The concentration of the oxidizing agent in the second liquid, although it is not particularly limited, is preferably 10% by mass or more and more preferably 20% by mass or more. The upper limit thereof is preferably 50% by mass or less and more preferably 40% by mass or less. By setting the concentration to the above-described range, a condition suitable for mixing with the first liquid can be achieved and a favorable concentration region in the above-described etching liquid can preferably be achieved.

In the case where the above-described surface uniformizing agent is used, it is preferable that the surface uniformizing agent is preliminarily added to the first liquid side. Alternatively, a liquid composition in which a water-soluble organic solvent has been added to an aqueous medium is preliminarily prepared and the liquid composition may be mixed as a third liquid with the first liquid and the second liquid.

Figure 3:
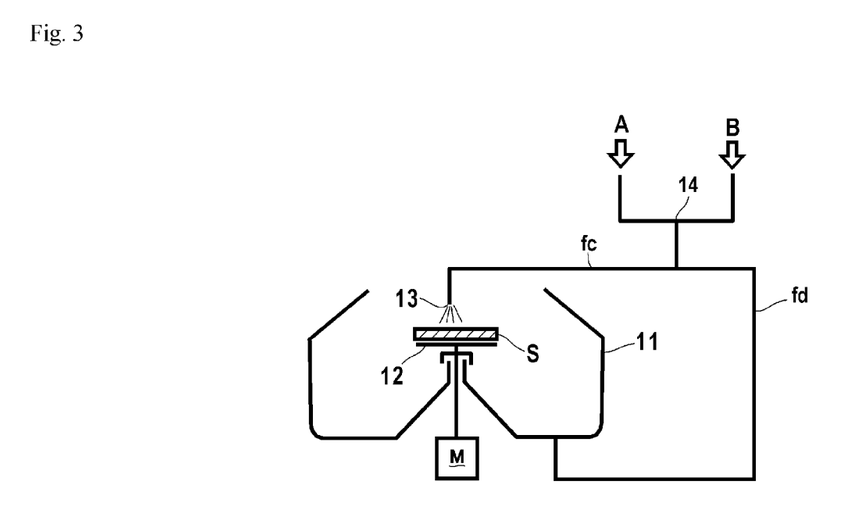
FIG. 3 is a configuration diagram showing a part of the wet-etching equipment according to a preferable embodiment of the present invention.

The procedure for mixing the first liquid with the second liquid, although it is not limited, is preferably a method of putting the first liquid and the second liquid into circulation in a separate flow channel and making them converge at the junction portion of the flow channels, thereby mixing them. After that, it is preferable that the etching liquid obtained by convergence is further put into circulation in a flow channel and then discharged or sprayed from a discharge opening, thereby bringing it contact with a semiconductor substrate. In this embodiment, a step of from converging-mixing at the junction portion to contacting with the semiconductor substrate is preferably conducted "on a timely basis (timely)" described above. This is explained below by using FIG. 3. The prepared etching liquid is sprayed from discharge opening 13 and applied onto the upper surface of semiconductor substrate S in reaction container 11. In the embodiment shown in the figure, two liquids of A and B are supplied and converged at junction portion 14. After that, the mixture is moved to discharge opening 13 through flow channel fc. Flow channel fd shows a return path for reuse of the chemical liquid. It is preferable that semiconductor substrate S is placed on rotating table 12 and rotated together with rotating table 12 by means of rotary drive member M. Note that the embodiment using substrate-rotation-type equipment can also be similarly applied to a processing using an etching liquid which is not used in a kit form.

(Container)

The etching liquid of the present invention (whether it is a kit or not) can be stored, transported and used by filling it into an arbitrary container, as far as corrosion resistance properties and the like are not concerned. Further, for semiconductor application, it is preferred that the container have high cleanness and less elution of impurities therefrom. Examples of available containers include "CLEAN BOTTLE" series manufactured by AICELLO CORPORATION, and "PURE BOTTLE" manufactured by KODAMA PLASTICS Co., Ltd. However, the present invention is not limited to these.

[Condition of Etching]

In the present embodiment, the conditions for etching are not particularly limited. Either single wafer type (spray-type) etching or immersion type (batch type) etching may be applicable. In the spray-type etching, a semiconductor substrate is transported or rotated in the prescribed direction and an etching liquid is sprayed into the space, thereby bringing the etching liquid into contact with the semiconductor substrate. On the other hand, in the batch-type etching, a semiconductor substrate is immersed in a liquid bath constituted of an etching liquid, thereby bringing the etching liquid into contact with the semiconductor substrate in the liquid bath. These etching processes may be appropriately used depending on the structure, the material, and the like of a device.

The environmental temperature at which etching is conducted is preferably 40° C. or higher, more preferably 50° C. or higher, and particularly preferably 25° C. or higher, in the measurement method of temperature in Examples below. The upper limit thereof is preferably 80° C. or lower, and more preferably 70° C. or lower. By setting to the above lower limit or greater, a sufficient etching rate for the TiN layer can preferably be ensured. The feed rate of the etching liquid, although it is not limited, is preferably set to a range of from 0.05 to 1 L/min, and more preferably from 0.1 to 0.5 L/min. The feed rate of the etching liquid, when set to a higher degree, is preferably set to a range of from 0.1 to 3 L/min, and more preferably from 0.2 to 2 L/min. By setting to the above-described lower limit or greater, in-plane uniformity of etching can preferably be secured at more excellent level. By setting to the above-described upper limit or lower, stable selectivity at the time of continuous processing can preferably be secured. In the case of rotating a semiconductor substrate, although it varies depending on the size or the like, from the same viewpoint as the above, it is preferable to rotate the semiconductor substrate at the rate of 50 to 400 rpm. In the case of setting to higher rotation, it is preferable to rotate the semiconductor substrate at the rate of from 100 to 2000 rpm, and more preferably 300 to 1000 rpm.

In the case of the batch type, it is also preferable to control the liquid bath to the above-described temperature range from the same reason as the above. The immersing time of the semiconductor substrate, although it is not particularly limited, is preferably set to be from 0.5 to 30 minutes and more preferably from 1 to 10 minutes. By setting to the above-described lower limit or longer, in-plane uniformity of etching can preferably be secured. By setting to the above-described upper limit or lower, the performance required for reuse of the etching liquid can preferably be maintained.

In the single wafer type etching according to a preferable embodiment of the present invention, it is preferable to transport or rotate a semiconductor substrate in the prescribed direction and to spray an etching liquid into the space, thereby bringing the etching liquid into contact with the semiconductor substrate. The feeding rate of the etching liquid and the rotation rate of the semiconductor substrate are the same as already described earlier.

Figure 4:
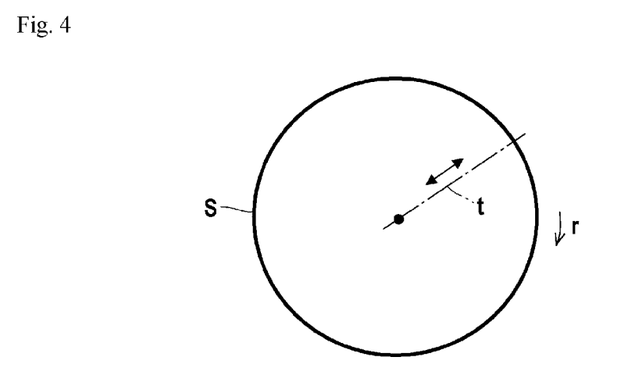
FIG. 4 is a top view diagrammatically showing the moving-track-line of the nozzle with respect to the semiconductor substrate according to one embodiment of the present invention.

In the single wafer type etching equipment configuration according to a preferable embodiment of the present invention, it is preferable to provide an etching liquid while moving a discharge opening (nozzle), as shown in FIG. 4. Specifically, in the present embodiment, when an etching liquid is applied onto semiconductor substrate S having a Ti-containing layer, the substrate is made to rotate in the r direction. On the other hand, the discharge opening is designed to move along with moving-track-line t extending from the central portion of the semiconductor substrate to the edge thereof. Thus, in the present embodiment, the rotation direction of the substrate and the moving direction of the discharge opening are set so as to be a different direction from one another whereby they are subjected to a relative movement with respect to one another. As a result, the configuration is such that an etching liquid can be evenly applied onto the entire surface of the semiconductor substrate whereby the uniformity of etching is favorably secured.

The moving rate of the discharge opening (nozzle), although it is not particularly limited, is preferably 0.1 cm/s or more, more preferably 1 cm/s or more. On the other hand, the upper limit is preferably 30 cm/s or less, more preferably 15 cm/s or less. The moving-track-line may be a straight line or a curve (for example, arc-like). In each case, the moving rate can be calculated from an actual length of the track-line and the time it takes for movement.

[Material to be Processed]

A material, which is etched by applying thereto the etching liquid according to the present embodiment, may be arbitrarily used. However, it is required that a substrate having a first layer containing TiN is applied. Herein, the term "layer containing TiN (TiN layer)" means that the layer may contain oxygen. When the TiN layer is especially used to distinguish it from a layer which does not contain oxygen, it may be called as a TiON layer or the like. In the present invention, the oxygen content of the TiN layer is preferably 10% by mole or less, more preferably 8.5% by mole or less and still more preferably 6.5% by mole or less. The lower limit side is 0.1% by mole or more, preferably 2.0% by mole or more, and more preferably 4.0% by mole or more.

In the present invention, it is important that the surface oxygen concentration of the TiN layer in this substrate is set to the above range. By setting to the above lower limit or greater and the above upper limit or less, the in-plane uniformity after etching of TiN can be achieved. Such surface uniformization effect becomes remarkable by using single wafer-type etching equipment. Further, this effect becomes also remarkable by applying it as a kit in which a plurality of liquids are combined.

Such adjustment of the oxygen concentration in the TiN layer in the substrate can be conducted by, for example, adjustment of the oxygen concentration in a processing room for CVD (Chemical Vapor Deposition) at the time of forming the TiN layer. Note that the first layer contains TiN as a major ingredient and may contain other ingredients within a range in which the effect of the present invention is exerted. This is true on the other layer such as the second layer, the metal layer and the like.

Note that, for the use of a metal hard mask (MHM), resistance to dry etching is required, and from this viewpoint, a substrate having a surface oxygen concentration of TiON minimized so as to be 0.1% by mole or less has been used from the past. The techniques disclosed in the conventional art (Patent Literatures) cited at the beginning of the present specification are also highly probable in this aspect. In contrast, in the present invention, from the knowledge that there is an adequate margin for the dry etching, instead, giving a priority to the suppression of in-plane variation of TiN processing rate at the time of removal by a wet etching processing, a substrate having the above oxygen concentration is used.

The above-described first layer is preferably subjected to etching at high etching rate. The thickness of the first layer is not particularly limited. However, when compositions of ordinary devices are considered, it is practical that the thickness is approximately from 0.005 to 0.3 μm. The etching rate (R1) of the first layer is not particularly limited. However, considering production efficiency, the etching rate is preferably 50 Å/min or more, more preferably 100 Å/min or more, and particularly preferably 200 Å/min or more. The upper limit is not limited in particular. However, it is preferable and practical that the upper limit is 500 Å/min or less, preferably 400 Å/min or less, and still more preferably 300 Å/min or less.

The method according to the present invention is preferably applied to a semiconductor substrate having a second layer containing a metal such as Cu, W, Co, Ni, Ag, Ta, Hf, Pt, Au or the like. Above all, Cu or W is preferably used as a material for the second layer.

Here, the technical significance of the metal layer is explained on the basis of an example in which copper (Cu) and tungsten (W) are used as a material thereof. Recently, in response to demands for speed-up of the semiconductor device (semiconductor equipment), miniaturization of wiring pattern, and high integration, reduction in capacity between wirings, improvement in electrical conductivity of the wire and improvement in electromigration resistance have been required. As regards the techniques for addressing these requirements, a multilayer-wiring technique of using copper which has high electrical conductivity and excellent electromigration resistance as a wire material and using a low dielectric constant layer (Low-K layer) as an insulation layer between layers has attracted attention. This copper wiring is generally disposed by a Dual Damascene process, on a copper seed layer (for example, dual layer composed of tantalum (Ta) and tantalum nitride (TaN)) which acts as a copper diffusion-preventing film for preventing copper from diffusion in the copper wiring.

On the other hand, contact of the semiconductor device is disposed through a tungsten plug by a single Damascene process in place of the Dual Damascene process which is ordinarily used at the time of forming a copper wiring and a via hole. In such multilayer-wiring technique, a Damascene method of forming a concave portion such as a wiring gutter, a through hole, and the like in a low dielectric constant layer and thereby burying therein copper is adopted. In this case, in order to form the concave portion with accuracy in the low dielectric constant layer by etching, it is necessary to use a mask composed of a material which has an adequately high-selection ratio to the low dielectric constant layer, as a mask to be used when the low dielectric constant layer is etched.

As the above low dielectric constant layer, an organic material is generally used, and as a result, in the case of etching the low dielectric constant layer using, as a mask, a photoresist layer composed of the same organic material as the above, it is presumed that the selection ratio becomes inadequate. In order to dissolve such problem, it has been proposed to use a hard mask layer composed of an inorganic material such as a TiN film, as a mask to be used at the time of etching. Further, removal of this hard mask layer is needed in the process after etching of the low dielectric constant layer. In particular, in the wet etching process, an exact removal of the above hard mask without corroding a metal layer such as tungsten plug and the like, or other wiring and/or low dielectric constant layer materials is desired.

The first layer (TiN) layer which constitutes a hard mask in the embodiment as described above is removed. As a result, in that case, the metal layer (second layer) is ordinarily located at the bottom of a via-hole or a trench (see FIG. 1 and FIG. 2).

The etching rate [R2] of the second layer (metal layer) is not limited in particular. However, it is preferable that the second layer is not removed to excess. The etching rate is preferably 100 Å/min or more, and more preferably 50 Å/min or more. The lower limit, although it is not limited in particular, is 0.001 Å/min or more for practical purposes.

The exposed width (d in the figure) of the metal layer is not limited in particular. However, from the viewpoint that advantages of the present invention become more remarkable, the exposed width is preferably 2 nm or more, and more preferably 4 nm or more. In a similar way, from the viewpoint of conspicuity of the effect, the upper limit is 1000 nm or less for practical purposes, preferably 100 nm or less, and more preferably 20 nm or less.

Further, the method of the present invention is also preferably applied to a semiconductor substrate having a third layer containing a metal compound such as SiO, SiN, SiOC, SiON, or the like. Note that in the present specification, when the composition of a metal compound is expressed by a combination of elements thereof, the composition means that compositions having arbitrary percentage of the elements are incorporated in a broad sense. For example, SiO means that it incorporates a thermally-oxidized film of silicon and $SiO_2$, and includes $SiO_x$. This is the common definition in the present specification, so that same applies to other metal compounds.

It is preferable that the third layer is also subjected to surface uniformization. The etching rate [R3] of the third layer, although it is not limited in particular, is preferably the same range as the above etching rate [R2] of the second layer.

[Production of Semiconductor Substrate Product]

In the present embodiment, a semiconductor substrate product having a desired structure is preferably produced through a step of providing a semiconductor substrate by forming the above-described first layer and second layer on a silicon wafer and a step of applying the etching liquid onto the semiconductor substrate thereby selectively dissolving the first layer. At this moment, the above-described specific etching liquid is used for etching.

Note that, in the present specification, as regards each of the steps involved in the etching and the method of producing the semiconductor substrate, it is allowed to rearrange the order of the steps arbitrarily and to apply them within a range in which the effect of the present invention is exerted. Further, in the present specification, the expression "preparation" means to prepare a particular material by synthesis or blend and in addition, to include procurement of prescribed materials by purchase or the like. Further, to utilize an etching liquid so as to etch each material of the semiconductor substrate is called "application". The embodiment thereof is not limited in particular. For example, this term is broad enough to include any embodiment of bringing an etching liquid and a semiconductor substrate into contact. Specifically, etching may be carried out by immersion using batch-type equipment, or may be carried out by discharge using single wafer-type equipment.

EXAMPLES

The present invention will be described in more detail based on examples given below, but the invention is not meant to be limited by these. Note that the amount and ratio shown in the Examples are based on mass standard, unless otherwise indicated.

Example 1, Comparative Example 1

Etching liquids were prepared to contain components shown in the following Table 1 in accordance with the compositions (% by mass) shown in the same table. Note that the balance is water (ultra-pure water).
(Method of Forming a TiN Substrate)
A TiN film having a surface oxygen concentration of less than 0.1% by mole was formed on a commercially available silicon substrate by CVD. Further, in accordance with a known method, metal layers (Cu layers) shown in Table were formed next to each of the TiN layer. These were used as test substrates. At the time of carrying out CVD, by controlling a low level of oxygen concentration in the gas phase, substrates having a different oxygen concentration from one another and substrates having a different diameter from one another were prepared. As regards the substrate having an oxygen concentration of 12.2%, a commercially available TiN substrate (manufactured by Silicon Valley microelectronics, Inc.) was used as it is. Note that the above substrates were prepared so that the metal layer had a width (d) of about 3 cm.
(Surface Oxygen Concentration)
Regarding a surface oxygen concentration of the TiN layer, concentration profiles of Ti, O and N in the depth direction from 0 to 30 nm were measured using etching ESCA (Quantera manufactured by ULVAC-PHI, INCORPORATED) and each of the contents at the depth of from 5 to 10 nm was calculated. An average of the oxygen contents was defined as the surface oxygen concentration.
(Etching Test)
With respect to the above-described test substrates, etching was carried out under the following conditions using single wafer-type equipment (POLOS (trade name) manufactured by SPS-Europe B.V.) and evaluation tests were carried out.

Processing temperature: 57° C.
Discharge rate: 1 L/min.
Wafer rotation number: 500 rpm
(Measurement Method of Processing Temperature)
A radiation thermometer IT-550F (trade name) manufactured by HORIBA, Ltd. was fixed at the height of 30 cm above the wafer in single wafer type equipment. The thermometer was pointed onto the wafer surface of 2 cm outside of the wafer center, and temperature measurement was conducted while making a chemical liquid flow. The temperature was measured by digital output from the radiation thermometer and continuously recorded on a personal computer. Among them, an averaged value of the temperature during the period of 10 seconds after stabilization of the temperature was used as a temperature on the wafer.
[Evaluation of in-Plane Uniformity]
Condition setting required for the etching depth at the center of a circular substrate was conducted at different time periods whereby the time period required to be 300 Å of the etching depth was confirmed. Then, the entire substrate was again etched at the confirmed time period, and at this moment, the measurement of the obtained etching depth was conducted at the centrally-directed position of 30 mm from the periphery of the substrate. Evaluation was conducted on the condition that as the depth is near 300 Å, in-plane uniformity becomes high. Specific criteria are as follows. The following shows a difference between the above two points (center and 30 mm positions) and evaluation was carried out by an average of five data.
AAA ±5 Å or less
AA ±more than 5 Å and 12 Å or less
A ±more than 12 Å and 15 Å or less
B ±more than 15 Å and 20 Å or less
C ±more than 20 Å and 30 Å or less
D ±more than 30 Å and 50 Å or less
E ±more than 50 Å
(Etching Rate)
As regards the etching rate (ER) of the TiN layer, evaluation was carried out by the following segmentation. The etching rate (Rx) was calculated by measurement of the film thickness before and after the etching processing using ellipsometry (Spectroscopic ellipsometer VASE, manufactured by J. A. Woollam Japan was used). A mean value of 5 points was adopted (measurement condition and measurement range: 1.2-2.5 eV, measured angle: 70 and 75 degrees).
A 300 Å/min or more
B 200 Å/min or more and less than 300 Å/min
C 100 Å/min or more and less than 200 Å/min
D 50 Å/min or more and less than 100 Å/min
E less than 50 Å/min
(1 Å is equivalent to 0.1 nm)

TABLE 1

| No. | chemical liquid | $H_2O_2$ % by mass | HF % by mass | Water | TiN No. | Substrate $O_2$ - concentration (% by mole) | Diameter (inch) | TiN in-plane uniformity | TiN ER | Cu in-plane uniformity |
|---|---|---|---|---|---|---|---|---|---|---|
| 101 | 1 | 13 | 0.2 | balance | 1 | 0.2 | 6 | C | B | C |
| 102 | 1 | 13 | 0.2 | balance | 2 | 1.9 | 6 | B | B | C |
| 103 | 1 | 13 | 0.2 | balance | 3 | 4.1 | 6 | A | B | C |
| 104 | 1 | 13 | 0.2 | balance | 4 | 6.0 | 6 | AA | B | C |
| 105 | 1 | 13 | 0.2 | balance | 5 | 8.1 | 6 | B | B | C |
| 106 | 1 | 13 | 0.2 | balance | 6 | 9.9 | 6 | C | B | C |
| 107 | 1 | 13 | 0.2 | balance | 7 | 6.1 | 8 | AAA | B | C |
| 108 | 1 | 13 | 0.2 | balance | 8 | 6.1 | 12 | AAA | B | C |
| 109 | 2 | 13 | 0.8 | balance | 7 | 6.1 | 8 | AA | B | C |
| 110 | 3 | 13 | 0.1 | balance | 7 | 6.1 | 8 | B | B | C |
| C11 | 1 | 13 | 0.2 | balance | 9 | less than 0.1 | 6 | D | E | C |
| C12 | 1 | 13 | 0.2 | balance | 10 | 12.2 | 6 | D | B | C |

(Annotation of the Table)
Tests Beginning with C Indicate Comparative Examples.

From the above results, it is found that according to the present invention, in conjunction with suitable removal of TiN, good in-plane uniformity after etching of the TiN layer and the metal layer can be hold. Note that TiN is destined to be removed in the manufacturing process, and therefore the in-plane uniformity does not directly influence product performance, but it may cause removal unevenness. When reduction in the processing time is considered, the influence of the in-plane uniformity becomes conspicuous. In other words, upgrading of the in-plane uniformity becomes important because it leads to improvement in productivity.

Further, a substrate wherein TiN and W were provided together was prepared and a similar experiment was carried out. As a result, a similar result was also obtained in terms of the in-plane uniformity of W.

Example 2, Comparative Example 2

Etching tests were carried out in the same manner as Example 1, except that the additives to be used were changed as shown in Table 2. The results are shown in Table 2.

TABLE 2

| No. | $H_2O_2$ (% by mass) | HF (% by mass) | Sulfuric acid (% by mass) | Surface uniformizing agent Compound 1 (% by mass) | Surface uniformizing agent Compound 2 (% by mass) | Water | substrate TiN No. | substrate $O_2$ concentration (% by mole) | substrate Diameter (inch) | TiN in-plane uniformity | Cu in-plane uniformity |
|---|---|---|---|---|---|---|---|---|---|---|---|
| 101 | 13 | 0.2 | — | — | — | balance | 1 | 0.2 | 6 | C | C |
| 201 | 13 | 0.2 | — | DEGMME (60) | — | balance | 1 | 0.2 | 6 | A | C |
| 202 | 13 | 0.2 | — | TetraEGDME (60) | — | balance | 1 | 0.2 | 6 | B | C |
| 203 | 13 | 0.2 | — | PG (60) | — | balance | 1 | 0.2 | 6 | B | C |
| 204 | 13 | 0.2 | — | TriEGDME (60) | — | balance | 1 | 0.2 | 6 | B | C |
| 205 | 13 | 0.2 | 1 | DEGMME (60) | — | balance | 1 | 0.2 | 6 | A | C |
| 206 | 13 | 0.2 | 1 | DEGMME (60) | V-5 (0.5) | balance | 1 | 0.2 | 6 | AAA | C |
| 207 | 13 | 0.2 | 1 | DEGMME (60) | V-5 (0.5) | balance | 6 | 9.9 | 6 | AAA | C |

DEGMME: diethylene glycol monomethyl ether
TetraEGDME: tetraethylene glycol dimethyl ether
PG: propylene glycol
TriEGDME: triethylene glycol dimethyl ether
Compound 1: oxygen-containing organic compound
Compound 2: nitrogen-containing organic compound/aromatic compound From the above results, it is found that much more excellent in-plane uniformity after etching can be ensured according to a preferable embodiment of the present invention.

Example 3

Etching tests were carried out in the same manner as Example 1, except that surface uniformizing agents shown in the following Table 3 were used and the substrate composed of the TiN substrate having a surface oxygen concentration of 6.0% by mole and a diameter of 6 inches (equivalent to the TiN substrate 4 in Table 1) was used. The results are shown in Table 3.

TABLE 3

| No. | $H_2O_2$ % by mass | HF % by mass | Sulfuric acid % by mass | Compound 1 (% by mass) | Compound 2 (% by mass) | Water | Cu in-plane uniformity |
|---|---|---|---|---|---|---|---|
| 301 | 13 | 0.2 | — | — | — | balance | C |
| 302 | 13 | 0.2 | 1 | DEGMME(60) | I-1(0.5) | balance | AA |
| 303 | 13 | 0.2 | 1 | DEGMME(60) | I-2(0.5) | balance | AA |
| 304 | 13 | 0.2 | 1 | DEGMME(60) | I-3(0.5) | balance | AAA |
| 305 | 13 | 0.2 | 1 | DEGMME(60) | I-4(0.5) | balance | AAA |
| 306 | 13 | 0.2 | 1 | DEGMME(60) | I-5(0.5) | balance | A |
| 307 | 13 | 0.2 | 1 | DEGMME(60) | I-6(0.5) | balance | AAA |
| 308 | 13 | 0.2 | 1 | DEGMME(60) | VII-2-2(0.5) | balance | AAA |
| 309 | 13 | 0.2 | 1 | DEGMME(60) | VII-2-4(0.5) | balance | B |
| 310 | 13 | 0.2 | 1 | DEGMME(60) | III-2(0.5) | balance | AAA |
| 311 | 13 | 0.2 | 1 | DEGMME(60) | III-3(0.5) | balance | AAA |
| 312 | 13 | 0.2 | 1 | DEGMME(60) | IX-1(0.5) | balance | AAA |

TABLE 3-continued

| No. | $H_2O_2$ % by mass | HF % by mass | Sulfuric acid % by mass | Compound 1 (% by mass) | Compound 2 (% by mass) | Water | Cu in-plane uniformity |
|---|---|---|---|---|---|---|---|
| 313 | 13 | 0.2 | 1 | DEGMME(60) | III-4(0.5) | balance | B |
| 314 | 13 | 0.2 | 1 | DEGMME(60) | VII-3-1(0.5) | balance | B |
| 315 | 13 | 0.2 | 1 | DEGMME(60) | V-1(0.5) | balance | AA |
| 316 | 13 | 0.2 | 1 | DEGMME(60) | V-2(0.5) | balance | AA |
| 317 | 13 | 0.2 | 1 | DEGMME(60) | VII-4-1(0.5) | balance | A |
| 318 | 13 | 0.2 | 1 | DEGMME(60) | VII-1-1(0.5) | balance | A |
| 319 | 13 | 0.2 | 1 | DEGMME(60) | VII-1-2(0.5) | balance | A |
| 320 | 13 | 0.2 | 1 | DEGMME(60) | V-5(0.5) | balance | AAA |

(Annotation of the Table)
Compound 1: oxygen-containing organic compound
Compound 2: nitrogen-containing organic compound/aromatic compound As is apparent from the above results, it is found that, according to the present invention, much higher in-plane uniformity of the metal layer can be achieved by applying a surface uniformizing agent (nitrogen-containing organic compound) or by changing a kind thereof on request. Note that the etching rate of TiN and the in-plane uniformity of TiN were not overly deteriorated by addition of the surface uniformizing agent and these performances were maintained in good condition.

Example 4

Etching tests were carried out in the same manner as No. 309 in Example 3, except that the etching conditions were changed as in the following Table 4. The results are shown in the following table.

TABLE 4

| Example | Equipment | Processing temperature (° C.) | Swing speed (cm/s) | Liquid-feeding form | Elapsed time from mixing (min) | Cu in-plane uniformity |
|---|---|---|---|---|---|---|
| 401 | SWT | 70 | 11 | 1 | — | B |
| 402 | Batch type | 70 | — | 1 | — | C |
| 403 | SWT | 80 | 11 | 1 | — | C |
| 404 | SWT | 60 | 11 | 1 | — | A |
| 405 | SWT | 50 | 11 | 1 | — | B |
| 406 | SWT | 40 | 11 | 1 | — | C |
| 407 | SWT | 70 | 15 | 1 | — | C |
| 408 | SWT | 70 | 10 | 1 | — | B |
| 409 | SWT | 70 | 9 | 1 | — | A |
| 410 | SWT | 70 | 7 | 1 | — | AA |
| 411 | SWT | 70 | 5 | 1 | — | A |
| 412 | SWT | 70 | 3 | 1 | — | B |
| 413 | SWT | 70 | 2 | 1 | — | C |
| 414 | SWT | 70 | 1 | 1 | — | C |
| 415 | SWT | 70 | 10 | 2 | 11 | C |
| 416 | SWT | 70 | 10 | 2 | 7 | B |
| 417 | SWT | 70 | 10 | 2 | 5 | A |
| 418 | SWT | 70 | 10 | 2 | 2 | AA |
| 419 | SWT | 70 | 10 | 2 | ≤1 | AA |
| 420 | SWT | 60 | 7 | 2 | ≤1 | AAA |

(Annotation of the Table)
SWT: Nozzle Swing Single Wafer-Type Equipment
  POLOS (product name) manufactured by SPS-Europe B.V.
Batch Type: Batch Type Equipment
  MANUAL WET BENCH (product name) manufactured by Seto Giken Kogyo Co., Ltd.
Swing Speed . . . Swing Speed Of The Discharge Opening That Provides A Liquid chemical.
Liquid-Feeding Form
  1: A liquid chemical was prepared and applied as one liquid (the liquid was applied immediately after the liquid preparation).
  2: A liquid chemical kit having two liquids was prepared and mixed (the equipment in FIG. 3 was used).

In case of a kit having two liquids, the kit was prepared by using a 35% by mass hydrogen peroxide aqueous solution in a first liquid and by adding both other ingredients and water to a second liquid so that upon mixing, the mixture has the concentration of the one liquid.

Elapsed Time From Mixing: Time Elapsing From When A Liquid Chemical Kit Having Two liquids was mixed till when the mixture was applied to a substrate From the above results, it is found that both production methods of using single wafer-type equipment as well as mixing liquids by using a kit having two liquids are also preferable embodiments that improve the in-plane uniformity of the metal layer.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 TiN layer (first layer)
2 SiON layer (third layer (1))

3 SiOC layer (third layer (2))
4 Cu/W layer (second layer)
5 via
10, 20 semiconductor substrate
11 reaction container
12 rotating table
13 discharge opening
14 junction portion
S substrate

The invention claimed is:

1. An etching method comprising: at the time of processing a substrate having a first layer containing titanium nitride (TiN) and a second layer containing a transition metal,
    selecting a substrate in which a surface oxygen content of the first layer is from 0.1 to 10% by mole; and an etching rate of the first layer is 200A°/min or greater and less than 300A°/min.
    applying an etching liquid containing a hydrofluoric acid compound and an oxidizing agent to said substrate and thereby removing the first layer.

2. The etching method according to claim 1, wherein the transition metal is selected from Co, Ni, Cu, Ag, Ta, Hf, W, Pt and Au.

3. The etching method according to claim 1, wherein the hydrofluoric acid compound is a hydrofluoric acid or its salt.

4. The etching method according to claim 1, wherein the oxidizing agent is a nitric acid or a hydrogen peroxide.

5. The etching method according to claim 1, wherein the etching liquid further contains at least one surface uniformizing agent selected from the group consisting of a nitrogen-containing organic compound, an aromatic compound and an oxygen-containing organic compound.

6. The etching method according to claim 5, wherein the surface uniformizing agent includes a compound represented by any one of the following formulae (I) to (IX):

(I)

(II)

(III)

(IV)

(V)

(VI)

(VII)

(VIII)

(IX)

wherein $R^1$ to $R^{30}$ each independently represent a hydrogen atom or a substituent; in this case, neighbors adjacent to each other may be linked or ring-fused to form a cyclic structure; A represents a nitrogen atom.

7. The etching method according to claim 5, wherein the surface uniformizing agent is at least one selected from the group consisting of an alcohol compound having 2 to 15 carbon atoms and an ether compound having 2 to 15 carbon atoms.

8. The etching method according to claim 5, wherein the surface uniformizing agent is contained in a range of from 0.01 to 10% by mass.

9. The etching method according to claim 1, wherein the hydrofluoric acid compound is contained in a range of from 0.01 to 3% by mass.

10. The etching method according to claim 1, wherein the oxidizing agent is contained in a range of from 0.05 to 30% by mass.

11. The etching method according to claim 1, wherein a pH of the etching liquid is in a range of −1 or more and 5 or less.

12. The etching method according to claim 1, wherein a thickness of the first layer is from 0.005 to 0.3 μm.

13. A method of producing a semiconductor device comprising: removing a first layer containing titanium nitride (TiN) by the etching method according to claim 1; and then producing the semiconductor device from the remaining substrate.

14. The etching method according to claim 1, wherein the etching method is carried out by a single wafer etching.

15. The method of producing a semiconductor device according to claim 13, wherein the etching method is carried out by a single wafer etching.

16. An etching liquid for processing a substrate having a first layer containing titanium nitride (TiN) and a second layer containing a transition metal and for applying to a selected substrate in which a surface oxygen content of the first layer is from 0.1 to 10% by mole, wherein the etching liquid contains a hydrofluoric acid compound and an oxidizing agent.

17. The etching liquid according to claim 16, wherein the hydrofluoric acid compound is contained in a range of from 0.01 to 3% by mass.

18. The etching liquid according to claim 16, wherein the oxidizing agent is contained in a range of from 0.05 to 30% by mass.

19. The etching liquid according to claim 16, wherein a pH is from −1 to 5.

20. The etching liquid according to claim 16, further containing at least one surface uniformizing agent selected from the group consisting of a nitrogen-containing organic compound, an aromatic compound and an oxygen-containing organic compound.

* * * * *